United States Patent [19]

Niculescu

[11] 4,149,025
[45] Apr. 10, 1979

[54] METHOD OF FABRICATING THERMOELECTRIC POWER GENERATOR MODULES

[76] Inventor: Vasile Niculescu, 35B Ridgeview Heights, West Wellington, Conn. 06279

[21] Appl. No.: 851,929

[22] Filed: Nov. 16, 1977

[51] Int. Cl.$^2$ .............................................. H01L 35/02
[52] U.S. Cl. ....................................... 136/206; 29/573; 29/577 R; 136/203; 136/204; 136/211; 136/212
[58] Field of Search ............ 29/573, 577 R; 136/203, 136/204, 206, 211, 212, 213

[56] References Cited

U.S. PATENT DOCUMENTS

| | | | |
|---|---|---|---|
| 3,252,205 | 5/1966 | Hancock et al. | 136/212 X |
| 3,326,726 | 6/1967 | Bassett et al. | 136/203 |
| 3,509,620 | 5/1970 | Phillips | 136/211 X |
| 3,626,583 | 12/1971 | Abbott et al. | 136/212 X |
| 3,775,218 | 11/1973 | Hare et al. | 136/212 X |
| 3,781,176 | 12/1973 | Penn et al. | 136/212 |
| 3,887,365 | 6/1975 | Sherfey | 75/DIG. 1 |
| 3,977,909 | 8/1976 | Cremonese | 136/206 |

*Primary Examiner*—Leland A. Sebastian
*Attorney, Agent, or Firm*—David E. Brook

[57] ABSTRACT

An improved method of fabricating thermoelectric power generator modules, which are particularly useful in converting solar energy into electrical power and heat, is disclosed. This method involves the formation of an array of longitudinally elongated n- and p-type semiconductor elements tightly contained in a supporting matrix; slicing the supporting matrix containing the semiconductor elements to provide a plurality of matrix plates; and the application of a pattern of electrically conductive pads on opposite surfaces of the matrix plates to connect n- and p-type semiconductor elements, in series, thereby forming a thermoelectric power generator module. This method is simpler, less expensive and more adaptable to large scale production than methods heretofore proposed.

10 Claims, 18 Drawing Figures

U.S. Patent   Apr. 10, 1979   Sheet 1 of 3   4,149,025
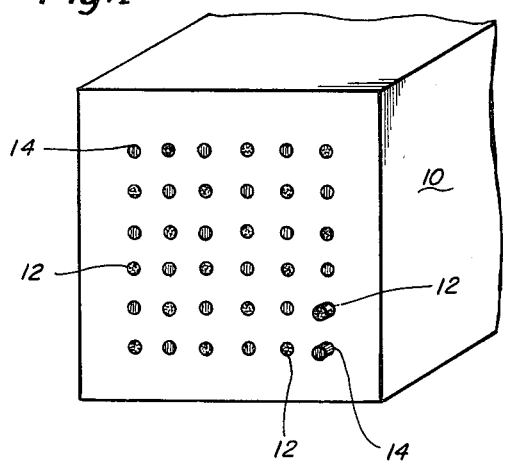
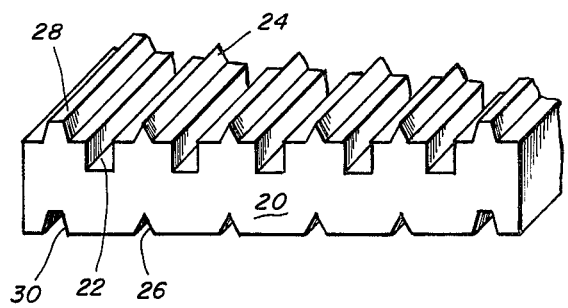
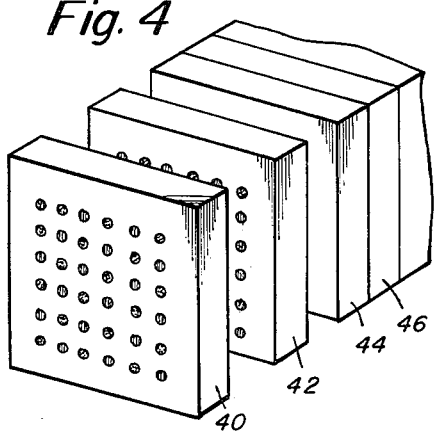
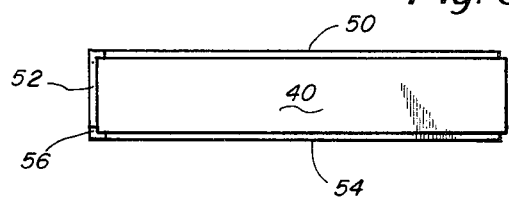
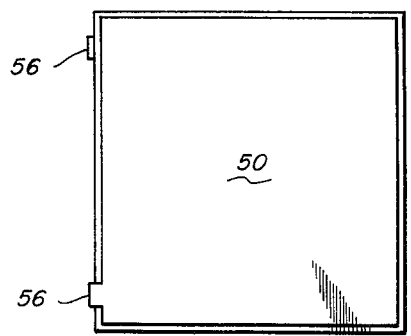
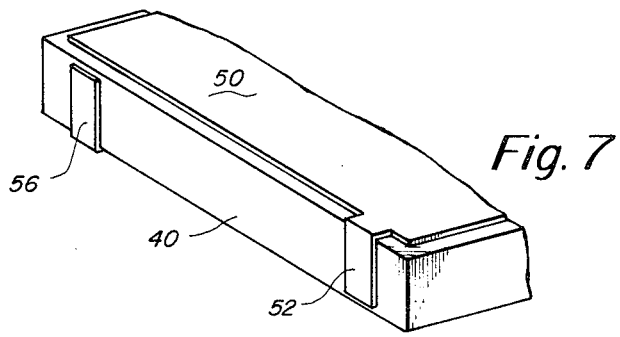

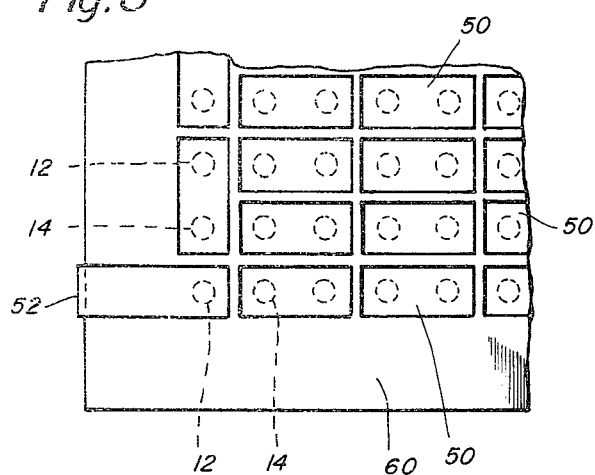
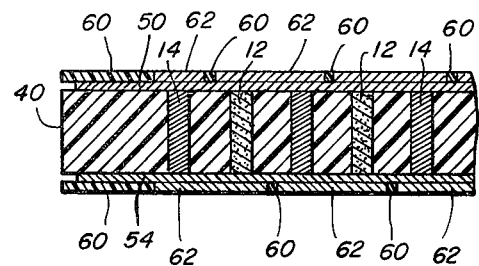
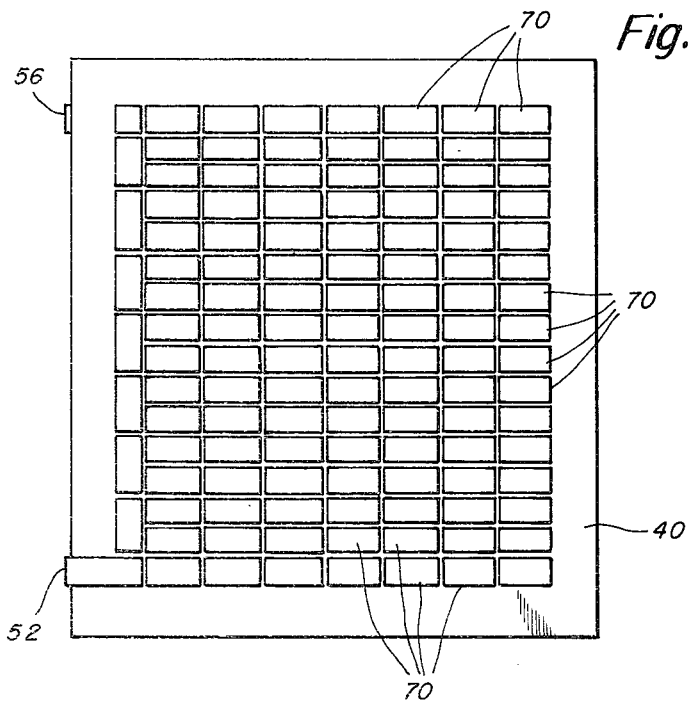
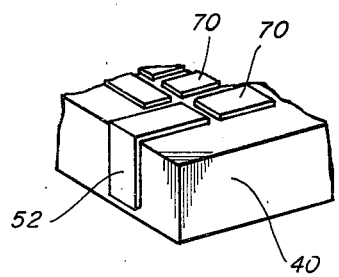
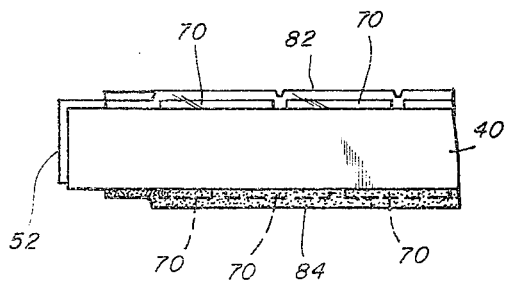
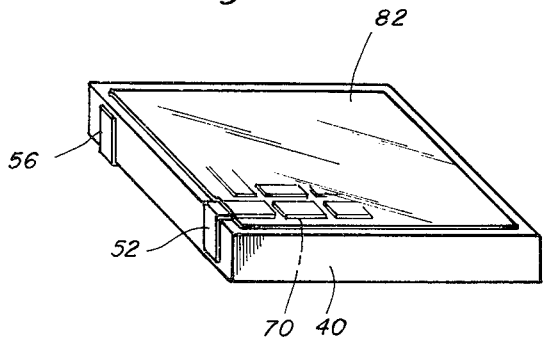

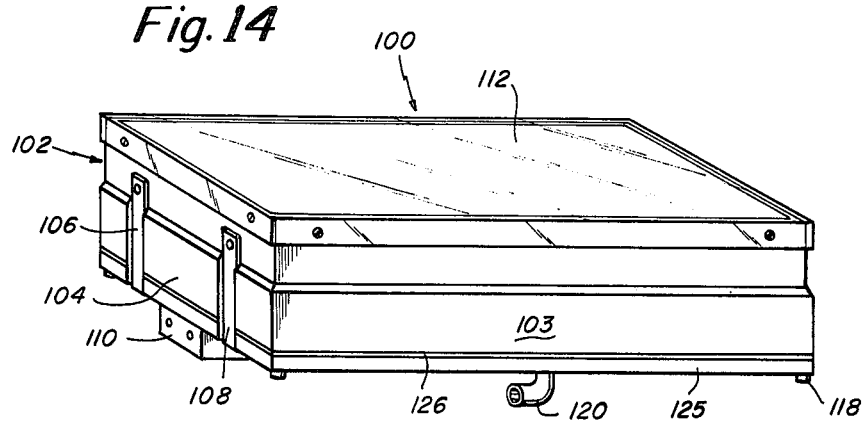
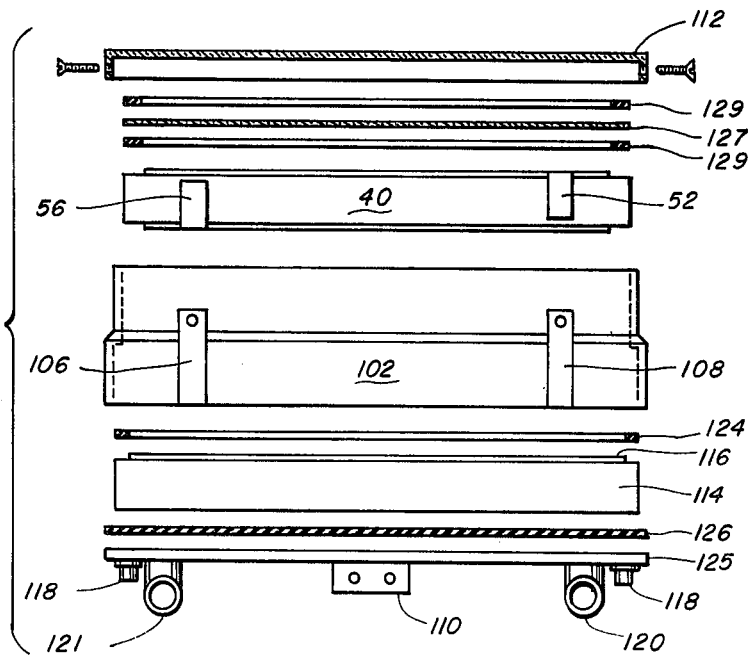
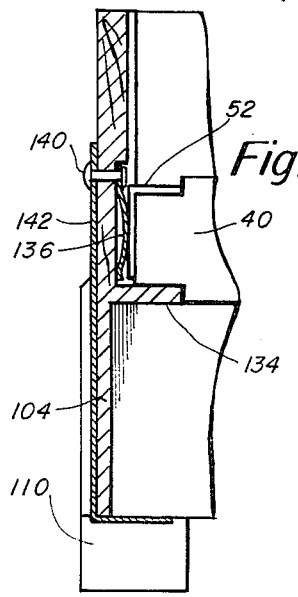
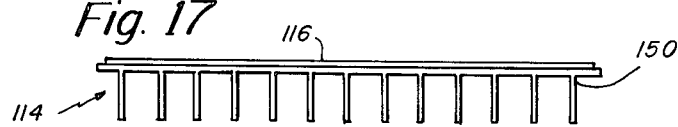
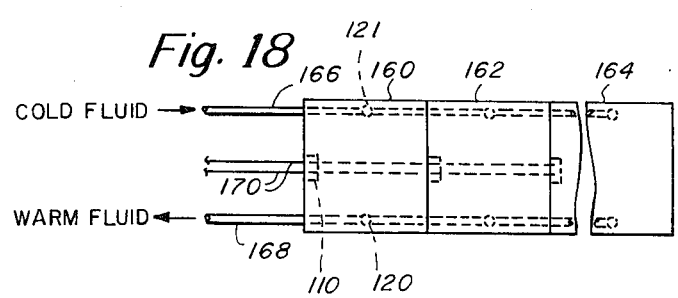

METHOD OF FABRICATING THERMOELECTRIC POWER GENERATOR MODULES

BACKGROUND OF THE INVENTION

1. Field of the Invention

This invention relates to fabrication techniques for thermoelectric power generator modules.

2. Description of the Prior Art

The need to convert solar radiation into more practical forms of energy, such as electrical power and heat, has become apparent recently. This need has resulted in a dramatic increase in the amount of research directed to more efficient and economical methods of converting solar energy into these other energy forms.

One major area of investigation is that involving the use of photovoltaic cells which generate electrical energy directly from sunlight. Typically, photovoltaic cells are based on a semiconductor layer having an ohmic contact on one side, a rectifying contact on the other side. Despite great advances, photovoltaic cells still require near crystal perfection for high efficiency operation which means that elaborate procedures must be used in producing these devices. Because of this, photovoltaic cells have not found wide use in terrestrial applications where cost of production is a major factor.

An alternative technique for generating electrical power from solar energy involves the thermoelectric or Seebeck effect. In this technique, a thermocouple is formed by connecting a pair of n- and p-type semiconductor materials with an electrical conductor at two junctions which are maintained at different temperatures. This produces an EMF between the two junctions which is a function of the temperature difference and the thermoelectric characteristics of the materials forming the thermocouple. The EMF can be increased by connecting more than one thermocouple in series, in which case the EMF becomes proportional to the number of thermocouples connected in series.

Solar energy can be used to heat one junction of a thermoelectric device to a temperature higher than the other. This provides a convenient way to convert solar radiation into electrical energy. Some attempts to fabricate thermoelectric power generators suitable for use in converting solar energy into electrical power are described in issued patents, including: Shaffer, U.S. Pat. No. 2,984,696; Stearns, U.S. Pat. No. 3,053,923; and Liphis, U.S. Pat. No. 3,088,989. Despite proposals such as those set forth in these patents, thermoelectric converters have not been widely accepted for use in solar energy conversion because they have suffered from a number of problems. Some of the most serious problems relate to the difficulty of fabricating arrays of thermoelectric elements because the materials required, such as bismuth telluride and lead telluride, have oriented or partially oriented crystals which inevitably make them brittle and difficult to prepare. For example, great care must be taken during any cutting operation required in fabricating thermoelectric power generators from such materials because they are so susceptible to damage. Furthermore, the difficulty of forming suitable junctions increases with the number of junctions to be formed, and many junctions are required if practical amounts of power are to be generated from solar energy.

SUMMARY OF THE INVENTION

The invention relates to a unique method for forming thermoelectric power generator modules. Longitudinally elongated n- and p-type semiconductor elements, such as rods or bars, are positioned to form an array in a supporting matrix. The supporting matrix can be a block of insulating material having holes drilled therein, a stack of insulating sheets containing supporting channels, or many other forms of a supporting matrix. The important characteristic is that the matrix provide good support for the elongated elements and electrical insulation between elements.

After the supporting matrix has been prepared, it is sliced in a direction transverse to the longitudinal axis of the elongated semiconductor elements. The result is a plurality of matrix plates which each contain and support an array of n- and p-type semiconductor elements, but which are considerably thinner than the original supporting matrix.

Subsequently, a pattern of electrically conductive pads is applied on opposite surfaces of the matrix plates to electrically connect, in series, n- and p-type semiconductor elements within the plate. At this point, each plate comprises an individual module suitable for use in a thermoelectric power generator.

Two further coatings are applied to adapt these modules for the conversion of solar energy into electrical energy and heat. One surface is coated with a layer having high solar radiation absorptivity coupled with low solar radiation emissivity. This, of course, will function in normal operation as the hot side of a thermoelectric power generator. On the opposite, or cold side, a coating is applied which has high solar radiation emissivity, which helps to maintain the temperature as low as possible on the cold side.

It can be appreciated that the method for fabricating thermoelectric power generator modules of this invention provides many significant advantages over methods heretofore used. This method is, for example, relatively simple and inexpensive, and yet lends itself to large scale production. Additionally, it provides a great deal of flexibility in that the modules can be designed in any aesthetically pleasing or functional shape desired.

The modules produced also offer significant advantages. They have a rugged and safe construction, and are thus not subject to damage under normal operating environments. Since each unit is a module, there is complete independence offered. Modular units can be added, subtracted or substituted for other modules at any time. Also, it should be noted that thermoelectric power generators function whenever there is a temperature difference between their opposite surfaces—they do not depend upon direct solar radiation being emitted at any particular time. Thus, they function on cloudy days, and for that matter, could even function in the reverse direction if the environmental conditions were such that the temperature at the hot side becomes cooler than the temperature at the cold side for any reason. Most importantly, the thermoelectric power generator modules described herein offer relatively high efficiencies in regard to the conversion of solar energy into electrical power and heat. dr

BRIEF DESCRIPTION OF THE DRAWINGS

FIG. 1 is a perspective view illustrating an array of n- and p-type longitudinally elongated semiconductor rods positioned in a supporting block matrix;

FIG. 2 is a perspective view of a sheet suitable for stacking to form a supporting matrix for elongated semiconductor bars;

FIG. 3 is a front elevational view of sheets of FIG. 2 stacked to support an array of n- and p-type semiconductor bars;

FIG. 4 is a perspective view illustrating four matrix plates produced by slicing the supporting matrix of FIG. 1 in a direction transverse to the axes of the semiconductor rods;

FIG. 5 is a side elevational view of a matrix plate of FIG. 4 having a thin uniform conductive coating applied to its opposite surfaces;

FIG. 6 is a top view of the coated plate of FIG. 5;

FIG. 7 is a partial perspective view illustrating conductive tabs formed by extensions of the uniform conductive coatings to the lateral sides of a plate;

FIG. 8 is a top view illustrating the positioning of a masking grid over one surface of a coated plate of FIGS. 5 and 6;

FIG. 9 is a cross-sectional side view of a plate after a metal coating has been applied over the grid shown in FIG. 8;

FIG. 10 is a top view illustrating electrically conducting pads formed by etching away the orginial uniform conductive coating at all areas not covered by the metal coating applied over the grid;

FIG. 11 is an exploded view illustrating an extension of a conductive pad to form a conductive terminal on a lateral edge of a thermoelectric plate;

FIG. 12 is a front elevational view illustrating a thermoelectric plate coated on both sides and suitable as a module for converting solar energy into electrical energy and heat;

FIG. 13 is a perspective view of a solar thermoelectric power generator module;

FIG. 14 is a perspective view of a solar thermoelectric power generator;

FIG. 15 is a schematic illustration of the disassembled elements present in the assembled solar thermoelectric power generator of FIG. 14;

FIG. 16 is a cutaway view illustrating how electrical contact is made through the walls of the module of FIG. 14;

FIG. 17 is a frontal cross-sectional view of the suitable cold reservoir for use in a solar thermoelectric power generator; and, FIG. 18 is a plan view illustrating an arrangement of three solar thermoelectric power generator modules in a system.

DESCRIPTION OF PREFERRED EMBODIMENTS

In FIG. 1, block 10 is illustrated as a supporting matrix for supporting an array of n-type semiconductor rods 12 and p-type semiconductor rods 14. Although block 10 is illustrated as having a square cross section, many other shapes also would be suitable. Block 10 is formed from a material which has good high temperature properties, is easy to shape, and which has relatively low heat and electrical conductivity. Particularly preferred materials are asbestos and polytetrafluorethylene, such as that sold under the trademark TEFLON by E. I. duPont deNemours and Company, although those skilled in the art will know many other suitable materials.

Semiconductor rods 12 and 14 are inserted into holes which are predrilled into block 10. Such holes have a size just large enough to allow the rods to be inserted but small enough to insure good contact with the rods. As shown, the holes are aligned so as to provide a parallel ralationship between the semiconductor rods 12 and 14 in both the horizontal and vertical directions. This is not always necessary, but is preferred.

An example of suitable semiconductor materials is an alloy of bismuth telluride and bismuth selenide, which can be suitably doped to provide both n- or p-types. Other suitable thermoelectric materials, include, but are not limited to, lead telluride, lead sulfide and silicon germanide.

Semiconductor rods 12 and 14 can be inserted into predrilled holes in block 10 by heating block 10 to an average temperature to 50°–60° C. if block 10 is fabricated from polytetrafluorethylene or other similar polymers. The slight expansion of block 10 facilitates rod insertion. Typically, semiconductor rods 12 and 14 might have a diameter of about 2–10 mm and a length of about 10–20 cm.

An alternative method for preparing a supporting matrix for an array of elongated semiconductor elements is illustrated in FIGS. 2 and 3. In this method, sheets 20 are formed with recessed channels 22 which are rectangularly-shaped, and thus suitable for supporting rectangularly-shaped semiconductor rods. Of course, circular recessed channels could also be used, or for that matter, many other shapes. Sheets 20 can be provided with pyramidal extensions 24 on their upper surface and matching pyramidal recessions 26 at their lower surface to aid in precise fitting and to eliminate lateral motion of the sheets when they are stacked as illustrated in FIG. 3. Additionally, enlarged extensions 28 and matching recessions 30 can be positioned towards the ends of sheets 20 to provide even stronger coupling at the edges of the sheets. As shown in FIG. 3, a series of sheets 20 can be stacked one upon the other after the insertion of alternating n-type semiconductor elements 32 and p-type semiconductor elements 34.

Sheets 20 can be formed from materials similar to those described for the supporting block 10 in FIG. 1. If Teflon ® polytetrafluorethylene is used, the sheets can be formed by machining or molding the polymer into an appropriate shape. Asbestos sheets could be formed by machining asbestos material.

If desired, stacked sheets 20 can be joined with a temperature resistant adhesive or transferred to a frame to add more strength to the array. Frames would be formed from materials similar to those used for the sheets themselves.

The method of forming an array illustrated in FIGS. 2 and 3 offers the advantages of easier assemblage of semiconductor elements and overcomes any problems which might be caused by differences in the coefficient of thermal expansion between the longitudinally elongated semiconductor elements and support material. Additionally, it offers the possiblity of continuous production of sheets for use in this manner.

FIG. 4 is a perspective view of four matrix slabs or plates 40, 42, 44 and 46 formed by slicing a supporting matrix, such as block 10 in FIG. 1, in a direction transverse to the axis of the longitudinally elongated semiconductor elements contained therein. Each matrix plate has a thickness chosen to maximize the desired properties of the eventual thermal electric power generator to be constructed. Typical thicknesses might be, for example, from about 0.5 to about 2 cm. Usually, it is preferred that plates 40, 42, 44, and 46 have uniform thicknesses which are provided by making parallel cuts into the supporting matrix. It should be understood, of course, that an array such as illustrated in FIGS. 2 and 3, or any other design, could be similarly sliced into matrix plates.

Slicing might be achieved by using a diamond impregnated slitting saw. The supporting matrix provides strong support at all points about the elongated semiconductor rods so that slicing does not result in chipping, fracture or other damage to these elements. In some cases, the surface regions of matrix slabs 40, 42, 44 and 46 might be cleaned and etched in an acid bath to repair any slight imperfections caused in the slicing operation. Each of the matrix slabs 40, 42, 44 and 46 serves as the fundamental unit of a thermoelectric power generator.

One technique for electrically connecting n- and p-type semiconductor elements in series is illustrated in FIGS. 5-11.

Initially, a uniform thin layer of a conductor is applied on opposite surfaces of a matrix plate. As illustrated in FIG. 5, uniform thin conducting layer 50 extends across the upper surface of matrix plate 40 and has a continuous extended portion running down one side to form a conductive tab 52. Similarly, a thin uniform conductor layer 54 is applied across the bottom surface of matrix slab 40 and continues to form conductive tab 56 on the same side of slab 40 as tab 52.

A plan view is illustrated in FIG. 6 showing the uniform conductive coating 50 across the top surface of slab 40 with the conductive tabs 52 and 56 extending onto one side of slab 40. Conductive tabs 52 and 56 are further illustrated in the exploded view presented in FIG. 7. The edges of the top and bottom surfaces, and the sides of matrix slab 40 are not coated with conductive coatings 50 and 54 which can be prevented by masking them with tape or the material prior to the coating process. Suitable coatings can be applied by a vacuum metallizing process to deposit a thin nickel layer or other conducting layer on the upper and lower surfaces of matrix slab 40.

The next step is the application of a fine grid of electrically non-conducting material as illustrated in FIG. 8. As shown, grid 60 is applied which has a pattern of openings therein in the shape of pads for each pair of n- and p-type semiconductor terminals. Grid 60 might be formed, for example, from Teflon ® polytetrafluoroethylene, poly(methyl methacrylate), or other materials.

After a grid has been applied to both sides of a matrix plate, another coating, which can be metal, is applied over the original coatings 50 and 54 where they are exposed to coating through grid 60. This coating can be a metal coating formed by electroplating or otherwise, and this protective coating would typically have a thickness of about 0.5 mm to about 2 mm. The resulting structure is illustrated in FIG. 9 which shows an additional metal coating 62 on both surfaces of matrix plate 40 at all areas not covered by grid 60. Semiconductor rods 12 and 14, of course, extend through matrix plate 40 and are connected by the metal coatings 50 and 54.

After the application of metal layer 62, grid 60 is removed from both surfaces of matrix slab 40. The portions of metal layers 50 and 54 having no protective metal coating thereover are etched with an acid treatment to remove them. This might be achieved, for example, by applying a grid having the same size and shape as grid 60 and having one side made from a porous material impregnated with acid. Etching is quite simple because layers 50 and 54 are very thin. Subsequent to etching, the slab is subsequently washed. The plate now contains a series of thermocouples formed by connecting all n- and p-type semiconductor elements with metallic pads 70 as illustrated in FIG. 10. An exploded view of side terminal 52 is illustrated in FIG. 11.

Location of both terminals 52 and 56 on the same lateral edge of matrix slab 40 is not essential but does facilitate connection of plates to a power generator assembly.

FIG. 12 illustrates a front elevational view of a thermoelectric plate 40, according to this invention, and having further coatings applied to make it suitable for converting solar energy to electrical power. On one surface, an electrically insulating material having high solar radiation absorptivity in the solar spectrum and low infrared radiation emissivity in the infrared region is deposited to form solar absorbing layer 82. A suitable material, for example, would be "Nickel Black", which is a combination of oxides and sulfides of nickel and zinc having an absorptance for solar energy, $\alpha$ equal to 0.94 for $\lambda$ smaller than 3 $\mu$m and an emittance $\epsilon = 0.11$ for $\lambda$ greater than 3 $\mu$m at a typical temperature for the top face. A typical thickness for such a layer would be about 1 mm.

On the opposite surface of plate 80, coating 84 is applied which is also electrically insulating but has high infrared radiation emissivity. For example, lamp black or other commercially available materials can be used. This helps to insure the coldest possible temperature at the cold surface since the total electrical energy generated is proportional to the temperature differences between one surface and the other. It is preferred to have lower coating 84 be uniformly flat as illustrated in FIG. 11. On the other hand, the solar absorbing layer 82 might have a more intricate design, such as one having the valleys illustrated, to increase the surface area available for solar absorption.

FIG. 13 shows a perspective view of a thermoelectric power generator plate for converting solar energy into electrical energy according to this invention. Therein, thermoelectric plate 40 is shown having a solar absorbing coating 82 on one surface. As can be seen, coating 82 does not extend to the extremities of each side thus leaving an outer edge which is helpful in mounting plates into modules. Also shown are electrical contacts 52 and 56, on the same lateral side of the solar plate.

An assembled modular unit for converting solar energy into electrical power and heat is illustrated in FIG. 14. As illustrated, solar thermoelectric power generating module 100 has a boxlike frame 102 open at the top and bottom and formed from four sidewalls (two of which are not shown). As can be seen, the lower portions of sidewalls 103 and 104 are thicker than the upper portions to provide additional structural strength. Additionally, sidewall 104 contains two channels for electrical contacts 106 and 108. Electrical contacts 106 and 108 extend through sidewall 104 and make electrical contact with a thermoelectric plate. Thus, electrical energy generated by a thermoelectric plate can be conducted along contacts 106 and 108 to a suitable outlet, such as electrical outlet 110. Upper cover 112 can be attached to the open boxlike structure by screws or other fastening means. Upper cover 112 is transparent to the solar spectrum but has high emissivity for infrared radiation, and thus serves to allow solar radiation to pass to the thermoelectric plate inside module 100 but to trap infrared radiation within module 100. Cover 112 also serves as protection from the environment. Plate 125 extends along the bottom of module 100 and consists of a flat plate with good heat conducting characteristics. Plate 125 serves as a holder for a cold reservoir (not shown) which has fluid outlet 120 thereby allowing water or other fluid which has been heated by passing through the cold reservoir to leave the module. A fluid inlet on the other side of module 100 for the entrance of cold water is also present but not shown.

FIGS. 15-18 illustrate, in more detail, the assemblage of the module of FIG. 14.

In FIG. 15, the various elements are illustrated in a disassembled state. The basic structural unit is frame 102, which is formed from four sidewalls and is open at its top and bottom. Although illustrated as having a rectangular shape, any other shape could be used, of course. A cold radiator 114 is provided in good thermal contact with metal plate 116 which in turn is sealed to frame 102 by gasket 124. A base plate 125 is placed on the other side of radiator 114 and gasket 126 provides good sealing therebetween. Base plate 125 can be attached to frame 102 by screws 118 or any other suitable means. Subsequently, electric outlet 110 is attached. Thermoelectric plate 40 is then introduced into frame 102 so that its terminals 52 and 56 are aligned with outer connectors 108 and 106, respectively. Two protective covers 112 and 127 are then added and these are separated from plate 40 and each other by gaskets 129. Cover 112 is attached directly to frame 102 and serves to cover and seal the module. Cover 127 is simply placed over gasket 129 within frame 102. Both covers can be formed from transparent plastics having good thermal stability and mechanical properties, such as poly(methyl methacrylate). The number of covers used in addition to cover 112 is, of course, entirely optional. As can be appreciated, plate 40 can be easily removed from the completed module by simply removing cover 112.

FIG. 16 is a partial cutaway view of a section of module 100 illustrating the mounting of thermoelectric plate 40 to achieve electrical contact with the outer terminals. Therein, thermoelectric plate 40 is supported along one of the sidewalls 104 of frame 102 by a ledge 134. Leaf spring 136 serves as an inner electrical contact to the electrical contact 52 on the lateral side of thermoelectric plate 40. Metal pin 140 continues the electrical circuit through wall 104 and the head of pin 140 is in contact with lead 142 which terminates at electrical outlet 110.

Of course, other methods for establishing electrical contact with the thermoelectric plates in modules could be used. In, for example, a module intended for placement in a corrosive area, an alternative contact might be provided by simply replacing spring 136 with a pressure contact operable by a screw from the exterior of the module.

FIG. 17 illustrates a cross-sectional frontal view of a suitable cold radiator 114. Radiator 114 has a flat conducting plate 116 which would normally be designed to have an area approximately the same size as the coating on the cold side of the thermoelectric plate. A lower channelled member 150 is located beneath flat plate 116 and in thermal contact therewith. The cold reservoir could be formed from cast aluminum or other metal having good heat transfer properties. In practice, cooling fluid, such as cold water, is circulated in the channels provided. Efficient cooling is achieved because of the large surface area provided by the channelled section 150.

FIG. 18 illustrates a system for converting solar energy into electrical energy and heat which employs three solar thermoelectric generator modules 160, 162, and 164 according to this invention. The cold water conduit 166, warm water conduit 168, and electrical conduit 170 are each connected in series to modules 160, 162 and 164. More modules could be added or modules could be subtracted or another module could be substituted into this system with a minimum of effort.

Those skilled in the art will recognize many equivalents to the specific elements, components, materials, steps, etc. described as preferred embodiments herein. Such equivalents are intended to be covered by the following claims:

What is claimed is:

1. A method of fabricating thermoelectric power generator modules, each having an array of semiconductor elements tightly supported in a thin supporting matrix plate formed of electrically and thermally insulating material, the method comprising:
   a. providing said electrically and thermally insulating material of said plate in solid form;
   b. tightly supporting an array of longitudinally elongated n- and p-type semiconductor elements in a thick solid supporting matrix of said electrically and thermally insulating material of said plates;
   c. slicing said thick supporting matrix in a direction transverse to the longitudinal axis of the semiconductor elements to form a plurality of thin matrix plates, said matrix plates each supporting an array of n- and p-type semiconductor elements; and,
   d. applying a pattern of electrically conductive pads on opposite surfaces of said matrix plates to electrically connect n- and p-type semiconductor elements in series to form a thermoelectric power generator.

2. The method of claim 1 wherein said array of semiconductor elements comprises a three dimensional array formed from alternating n- and p-type semiconductor elements in substantially parallel relationship.

3. A method of claim 2 wherein said supporting matrix comprises a block of solid material having a series of channels extending therethrough.

4. A method of claim 3 wherein said channels are circular in cross-section.

5. A method of claim 2 wherein said supporting matrix comprises a series of stacked sheets, each sheet having therein supporting channels for said semiconductor elements.

6. A method of claim 1 wherein the application of a pattern of electrically conductive pads is done by depositing a uniform conductive layer on opposite surfaces of said matrix slabs, applying a masking grid thereover, electroplating a metallic layer over areas not covered by said grid, and etching said uniform conductive layers at areas not covered by the electroplated metal.

7. A method of claim 6 wherein conductive pads are simultaneously applied to at least one side of said matrix slabs, said conductive pads being suitable for conductive terminals to and from said plate.

8. A method of claim 1 including the additional steps of coating one surface of the thermoelectric power generator with an electrically insulating coating having high solar radiation absorptivity and low infrared emissivity and coating the other surface with an electrically insulating material having high infrared radiation emissivity to thereby form a solar thermoelectric power generator.

9. A modular unit for converting solar energy into electrical power and heat, comprising, in combination:
 a. a frame;
 b. a thermoelectric plate contained within said frame, said thermoelectric plate being coated on a first side with an electrically insulating material having high solar radiation absorptivity and low infrared emissivity and coated on a second side with an electrically insulating material having high infrared emissivity;
 c. means for circulating a cold liquid in thermal contact with the second side of said thermoelectric plate;
 d. a bottom cover;
 e. a transparent top cover;
 f. electrical contacts on the outside of said frame; and,
 g. means for electrically connecting the electrical contacts on the outside of said frame to the thermoelectric plate within said frame.

10. A modular unit of claim 9 wherein said means for electrically connecting comprise a pin extending through a wall of said frame and a spring member within said frame, said spring member being in electrical contact with said pin and said thermoelectric plate.

* * * * *